(12) United States Patent
Mignot et al.

(10) Patent No.: US 10,825,720 B2
(45) Date of Patent: Nov. 3, 2020

(54) SINGLE TRENCH DAMASCENE INTERCONNECT USING TIN HMO

(71) Applicant: International Business Machines Corporation, Armonk, NY (US)

(72) Inventors: Yann Mignot, Slingerlands, NY (US); Yongan Xu, Niskayuna, NY (US); Muthumanickam Sankarapandian, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/112,286

(22) Filed: Aug. 24, 2018

(65) Prior Publication Data
US 2020/0066575 A1   Feb. 27, 2020

(51) Int. Cl.
| | |
|---|---|
| H01L 23/48 | (2006.01) |
| H01L 21/768 | (2006.01) |
| H01L 23/532 | (2006.01) |
| H01L 21/033 | (2006.01) |
| H01L 21/02 | (2006.01) |
| H01L 21/311 | (2006.01) |

(52) U.S. Cl.
CPC .. *H01L 21/76802* (2013.01); *H01L 21/02167* (2013.01); *H01L 21/02178* (2013.01); *H01L 21/02186* (2013.01); *H01L 21/0337* (2013.01); *H01L 21/31116* (2013.01); *H01L 21/31144* (2013.01); *H01L 21/7682* (2013.01); *H01L 21/7684* (2013.01); *H01L 21/76847* (2013.01); *H01L 23/5329* (2013.01); *H01L 23/53209* (2013.01); *H01L 23/53238* (2013.01); *H01L 23/53266* (2013.01)

(58) Field of Classification Search
None
See application file for complete search history.

(56) References Cited

U.S. PATENT DOCUMENTS

| | | | |
|---|---|---|---|
| 6,120,641 | A  | 9/2000 | Stevens et al. |
| 6,448,176 | B1 | 9/2002 | Grill et al. |
| 6,534,809 | B2 | 3/2003 | Moise et al. |
| 6,551,931 | B1 | 4/2003 | Edelstein et al. |
| 6,573,606 | B2 | 6/2003 | Sambucetti et al. |

(Continued)

OTHER PUBLICATIONS

Hua Cui, "TiN Metal Hardmask Etch Residue Removal with Mask Pullback and Complete Mask Removal for Cu Dual Damascene Device," 2012 SEMI Advanced Semiconductor Manufacturing Conference, May 2012, pp. 305-307.

(Continued)

*Primary Examiner* — Hung K Vu
(74) *Attorney, Agent, or Firm* — Daniel Morris; Michael J. Chang, LLC

(57) ABSTRACT

Techniques for single trench damascene interconnect formation using TiN HMO are provided. In one aspect, a method for forming interconnects on a substrate includes: forming an underlayer on the substrate; forming a hardmask on the underlayer; patterning trenches in the hardmask that extend down to the underlayer; forming the interconnects in the trenches; removing the hardmask; and burying the interconnects in an ILD. The trenches can be patterned in the hardmask using a process such as sidewall image transfer. An interconnect structure is also provided.

18 Claims, 6 Drawing Sheets

(56) References Cited

U.S. PATENT DOCUMENTS

| | | | |
|---|---|---|---|
| 6,599,829 B2 | 7/2003 | Smith et al. | |
| 6,975,032 B2 | 12/2005 | Chen et al. | |
| 7,902,066 B2 | 3/2011 | Ye et al. | |
| 8,105,942 B2 | 1/2012 | Choi et al. | |
| 8,841,214 B2 | 9/2014 | Lee et al. | |
| 9,006,106 B2 | 4/2015 | Kao et al. | |
| 9,431,292 B1 | 8/2016 | Bonilla et al. | |
| 2006/0186548 A1* | 8/2006 | Enomoto | H01L 21/76808 257/758 |
| 2009/0131295 A1 | 5/2009 | Cui | |
| 2010/0130001 A1* | 5/2010 | Noguchi | H01L 21/76811 438/627 |
| 2012/0282779 A1* | 11/2012 | Arnold | H01L 21/0337 438/703 |
| 2014/0264896 A1* | 9/2014 | Lu | H01L 23/5329 257/773 |

OTHER PUBLICATIONS

Lee et al., "Feature-Size Dependence of Etch Rate in Reactive Ion Etching," J. Electrochem. Soc., vol. 138, No. 8, Aug. 1991, pp. 2439-2445.

Ed Korczynski, "Air-gaps in Copper Interconnects for Logic," Semiconductor Manufacturing & Design Community (Oct. 2014) (6 pages).

Mistkawi, "Fundamental Studies in Selective Wet Etching and Corrosion Processes for High-Performance Semiconductor Devices," Jan. 2010, Dissertations and Theses (225 pages).

A. Kushwaha, "Copper Interconnect Development At RIT," 18th Annual Microelectronic Engineering Conference, May 2000, pp. 74-79.

\* cited by examiner

SINGLE TRENCH DAMASCENE INTERCONNECT USING TIN HMO

FIELD OF THE INVENTION

The present invention relates to interconnect technology, and more particularly, to techniques for single trench damascene interconnect formation using titanium nitride (TiN) hardmask open (HMO).

BACKGROUND OF THE INVENTION

Back end of line (BEOL) interconnects are typically created using a dual damascene scheme for copper metallization with a titanium nitride (TiN) hard mask open (HMO) to define the interconnect trenches. See, for example, Hua Cui, "TiN Metal Hardmask Etch Residue Removal with Mask Pullback and Complete Mask Removal for Cu Dual Damascene Device," 2012 SEMI Advanced Semiconductor Manufacturing Conference. May 2012, pp. 305-307.

However, with this conventional process, the trench height is not an easy parameter to control. Namely, the trenches are typically patterned in a dielectric using a directional etching process such as reactive ion etching (RIE) and the depth of the trenches is based solely on the etch time. The effects of factors such as RIE lag can result in trenches of varying depths. RIE lag is the slowing of the average etch rate inside a trench as the width of the trench decreases. See, for example. Lee et al., "Feature-Size Dependence of Etch Rate in Reactive Ion Etching," J. Electrochem. Soc., vol. 138, no. 8, August 1991, pp. 2439-2445.

Accordingly, improved techniques for forming BEOL interconnects would be desirable.

SUMMARY OF THE INVENTION

The present invention provides techniques for single trench damascene interconnect formation using titanium nitride (TiN) hardmask open (HMO). In one aspect of the invention, a method for forming interconnects on a substrate is provided. The method includes: forming an underlayer on the substrate; forming a hardmask on the underlayer; patterning trenches in the hardmask that extend down to the underlayer; forming the interconnects in the trenches; removing the hardmask; and burying the interconnects in an interlayer dielectric (ILD).

In another aspect of the invention, another method for forming interconnects on a substrate is provided. The method includes: forming an underlayer on the substrate; forming a hardmask including titanium nitride (TiN) on the underlayer; forming mandrels on the hardmask; forming spacers along opposite sides of the mandrels; removing the mandrels selective to the hardmask and the spacers; using the spacers to pattern trenches in the hardmask that extend down to the underlayer; forming the interconnects in the trenches; removing the spacers and the hardmask; and burying the interconnects in an ILD.

In yet another aspect of the invention, an interconnect structure is provided. The interconnect structure includes: a substrate; an underlayer including a capping layer disposed on the substrate, and an ultralow-κ ILD disposed on the capping layer, wherein the capping layer includes a material selected from: silicon carbon nitride (SiCN), hydrogen silicon carbon nitride (SiCNH), aluminum nitride (AlN) and combinations thereof, and wherein the ultralow-κ ILD has a dielectric constant κ of less than 2.7; interconnects, disposed on the underlayer, including at least one metal selected from: copper (Cu), cobalt (Co), tungsten (W) and combinations thereof; and an ILD surrounding the interconnects.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming back end of line (BEOL) interconnects using a nitride hardmask such as titanium nitride (TiN) through the final metallization. After depositing and polishing of the metal, the hardmask is removed. By comparison, with conventional damascene processes the hardmask is removed after the dielectric reactive ion etching (RIE) of the interconnect trench just before the metallization.

Advantageously, the present techniques provide several notable features. First, as compared to conventional dual damascene schemes, the present techniques involve placing the metal (e.g., copper (Cu), etc.—see below) first rather than patterning interconnect trenches in a dielectric and then depositing the metal in the trenches. Thus, the effects of RIE lag which can lead to trenches of varying depths (see above) are avoided. Second, the dimensions of the interconnects are modulated directly in the hardmask rather than the metal plus via patterning in a dielectric. Third, the verticality of the interconnect is provided by the hardmask. Thus, the height/depth of the interconnect can be regulated simply by varying the thickness of the hardmask, allowing the interconnect trench to be stopped at a precise height based on the thickness of the hardmask. Fourth, based on the present process, the formation of air gap interconnects is possible by pinch off during final dielectric deposition.

Figure 1:
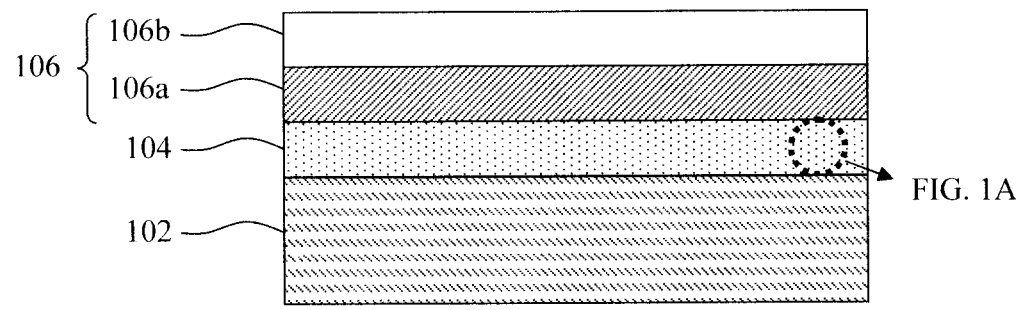
FIG. 1 is a cross-sectional diagram illustrating an underlayer having been disposed on a substrate, and a hardmask (including bottom and top hardmask layers) having been formed on the underlayer according to an embodiment of the present invention.

An exemplary methodology for forming BEOL interconnects in accordance with the present techniques is now described by way of reference to FIGS. 1-7. As shown in FIG. 1, the process begins with a substrate 102 onto which BEOL interconnects are to be formed. According to an exemplary embodiment, substrate 102 generically represents the portion of an integrated circuit containing individual complementary metal oxide semiconductor (CMOS) devices such as transistors, logic devices, memory elements, etc., i.e., what is typically referred to as the front end of line (FEOL).

Figure 1A:
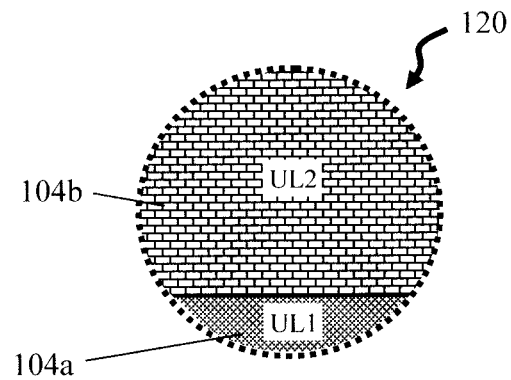
FIG. 1A is a magnified view of the underlayer according to an embodiment of the present invention.

An underlayer (UL) 104 is disposed on the substrate 102. According to an exemplary embodiment, the underlayer 104 is made up of a stack of layers. See, for example, FIG. 1A. Namely, referring briefly to FIG. 1A a magnified view 120 of underlayer 104 is provided. In this particular example, underlayer 104 is made up of a stack of underlayers (e.g., UL1, UL2, etc.) including, but not limited to, a capping layer 104a disposed on the substrate 102, and an interlayer dielectric (ILD) 104b disposed on the capping layer 104a.

Suitable materials for the capping layer 104a include, but are not limited to, dielectrics such as silicon carbon nitride (SiCN), hydrogen silicon carbon nitride (SiCNH) and/or aluminum nitride (AlN). Capping layer 104a can be deposited onto the substrate 102 using a process such as chemical vapor deposition (CVD), atomic layer deposition (ALD) or physical vapor deposition (PVD). According to an exemplary embodiment, capping layer 104a has a thickness of from about 5 nanometers (nm) to about 30 nm and ranges therebetween.

According to an exemplary embodiment, ILD 104b is an ultralow-K interlayer dielectric (ULK-ILD), e.g., having a dielectric constant κ of less than 2.7. By comparison, silicon dioxide ($SiO_2$) has a dielectric constant κ value of 3.9. Suitable ultralow-K dielectric materials include, but are not limited to, porous organosilicate glass (pSiCOH). ILD 104b can be deposited onto the capping layer 104a using a casting process such as spin coating, spray coating, etc. According to an exemplary embodiment, the second underlayer 104b has a thickness of from about 20 nm to about 50 nm and ranges therebetween.

Referring back to FIG. 1, a hardmask 106 is formed on the underlayer 104. According to an exemplary embodiment, the hardmask 106 is formed as a hardmask stack with multiple layers including, but not limited to, a bottom hardmask layer 106a and a top hardmask layer 106b. Suitable materials for bottom hardmask layer 106a include, but are not limited to, titanium nitride (TiN), which can be deposited onto the underlayer 104 using a process such as CVD, ALD or PVD. According to an exemplary embodiment, bottom hardmask layer 106a has a thickness of from about 5 nm to about 30 nm and ranges therebetween.

Suitable materials for top hardmask layer 106b include, but are not limited to, silicon oxide (SiOx) (e.g., with tetraethyl orthosilicate titanium (TEOS) as a silicon source), which can be deposited onto bottom hardmask layer 106a using a process such as CVD, ALD or PVD. According to an exemplary embodiment, top hardmask layer 106b has a thickness of from about 5 nm to about 30 nm and ranges therebetween.

While a hardmask stack is employed in the present example, embodiments are contemplated herein where a single layer hardmask is employed. For example, according to an alternative embodiment, hardmask 106 includes a single layer metal hardmask such as TiN. The use of a TiN hardmask is advantageous because it will be stripped by wet chemistry (see below). And the wet chemistry used needs to be compatible with the ULK 104 and the metal/liner (see below).

Figure 2:
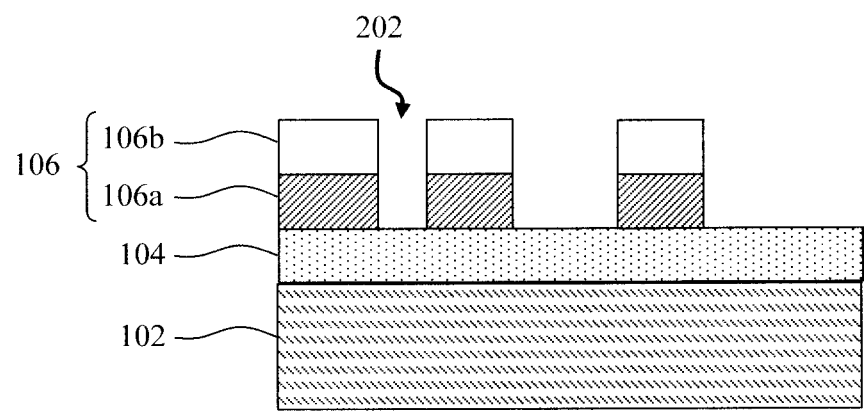
FIG. 2 is a cross-sectional diagram illustrating (first) trenches having been patterned in the hardmask according to an embodiment of the present invention.
Figure 3:
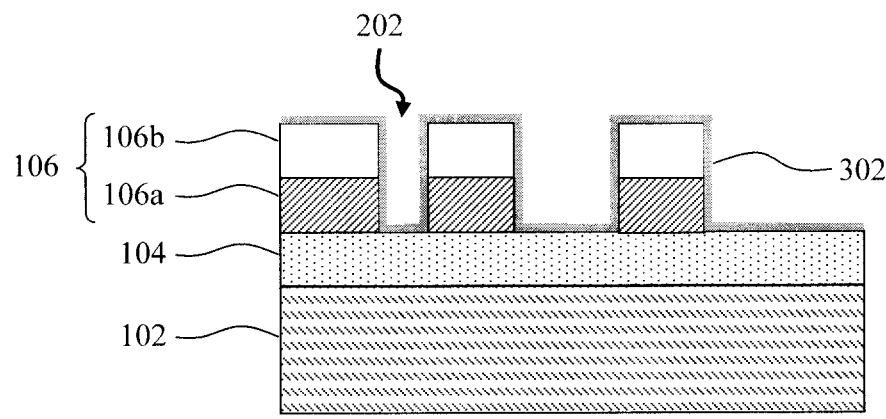
FIG. 3 is a cross-sectional diagram illustrating an (optional) conformal liner having been deposited onto the hardmask, lining the bottom and sidewalls of the trenches according to an embodiment of the present invention.

Next, as shown in FIG. 2 at least one trench 202 is patterned in the hardmask 106. Suitable techniques for patterning the trench(es) 202 in the hardmask 106 include, but are not limited to, direct patterning, sidewall image transfer (SIT) which is a self-aligned double patterning (SADP) process, extreme ultraviolet lithography (EUV), etc. Direct patterning can involve a multiple-step process whereby standard lithography and etching techniques are repeated multiple times (also referred to herein as "litho-etch-litho-etch" or "LELE") to create features with tight pitches.

As will be described in detail below. SIT is a pitch doubling technique. See, for example, the description of FIGS. 8-17, below. Namely, with SIT, direct patterning is used to form mandrels on a substrate. Spacers are formed on opposite sides of the mandrels. The mandrels are then removed selective to the spacers, and the spacers are used to pattern the substrate. Thus, for every mandrel there are two (self-aligned) spacers, hence the term self-aligned double patterning or SADP.

Advantageously. SIT enables the patterning of features at a sub-lithographic pitch. Namely, two spacers are placed for each patterned mandrel. Thus, the spacers can be present at a pitch that is below the resolution of the direct patterning process.

As shown in FIG. 2, the trenches 202 extend through both the top hardmask layer 106b (if present) and the bottom hardmask layer 106a, stopping on the underlayer. As will be described in detail below, the BEOL interconnects will be formed in the trenches 202. Thus, advantageously, the dimensions of the interconnects are directly modulated in the hardmask 106 via the dimensions of the trenches 202. By comparison, conventional processes involve using the hardmask to pattern trenches in a dielectric which can undesirably vary in depth due, e.g., to RIE lag (see above). In accordance with the present techniques, the depth of the trenches/interconnects can be regulated simply by varying the thickness of the hardmask 106.

Optionally, a conformal liner 302 is deposited onto the hardmask 106 and underlayer 104 at the bottom of the trenches 202, lining the bottom and sidewalls of the trenches 202. See FIG. 3. The use of a liner 302 is optional since its use depends on what interconnect metal(s) are being used. For instance, with copper (Cu) interconnects use of a liner 302 is preferable to prevent diffusion of the Cu into surrounding dielectrics and degradation of device performance. However, with metals such as cobalt (Co) and/or tungsten (W), such diffusion is not a concern. Therefore, when these other metals are used instead of Cu, a liner 302 is not needed.

Suitable materials for the liner 302 include, but are not limited to, titanium (Ti), tantalum (Ta), ruthenium (Ru), hafnium (Hf), titanium nitride (TiN) and/or tantalum nitride (TaN). By way of example only, according to one exemplary embodiment, liner 302 is a bilayer liner including a diffusion barrier layer of a refractory metal nitride such as TiN and/or TaN lining the trenches 202, and an adhesion promoter layer of metal such as Ti and/or Ta disposed on the barrier layer (to improve adhesion between the barrier layer and the interconnect metal). Liner 302 can be deposited using a conformal deposition process such as CVD, ALD or PVD. According to an exemplary embodiment, liner 302 has a thickness of from about 2 nm to about 10 nm and ranges therebetween.

Figure 4:
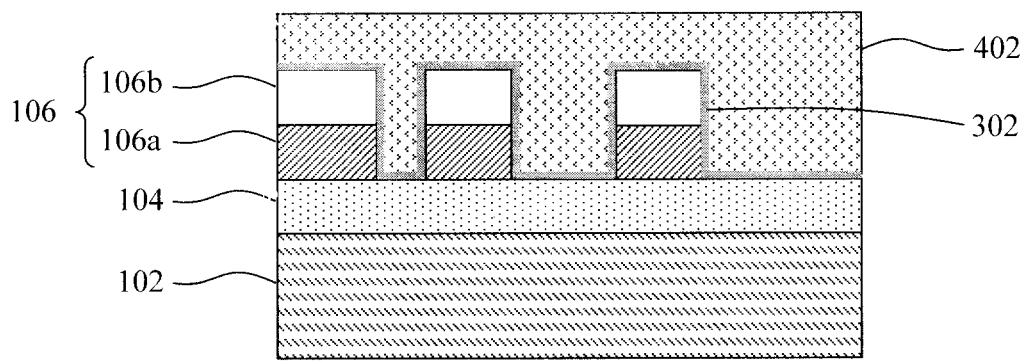
FIG. 4 is a cross-sectional diagram illustrating at least one metal having been deposited over the hardmask (and liner if present), filling the trenches according to an embodiment of the present invention.
Figure 5:
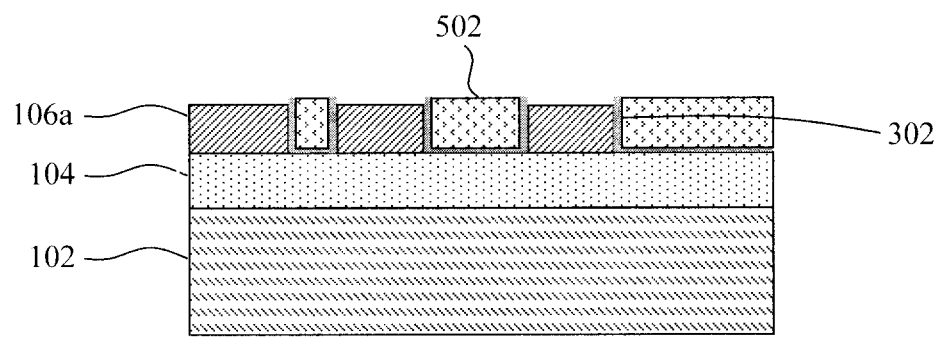
FIG. 5 is a cross-sectional diagram illustrating the excess metal and, if present, the liner and top hardmask layer having been removed forming interconnects in the first trenches according to an embodiment of the present invention.

As shown in FIG. 4, at least one metal 402 is then deposited over the hardmask 106 (and liner 302 if present), filling the trenches 202. As highlighted above, suitable metals include, but are not limited to, Cu. Co and/or W. As also highlighted above, the use of a liner 302 is preferred with metals like Cu, but optional in the case of metals such as Co and W.

By way of example only, the metal 402 can be deposited using a process such as electrochemical plating. For instance, a thin (e.g., from about 1 nm to about 3 nm) metal seed layer (not shown) can be deposited (e.g., by CVD. ALD or PVD) into/lining the trenches 202. Metal 402 is then plated onto the seed layer in the trenches 202. As shown in FIG. 4, the deposited metal 402 overfills the trenches 202.

A polishing process such as chemical mechanical polishing (CMP) is then used to remove the excess metal 402 and, if present, the liner 302 and top hardmask layer 106b over the bottom hardmask layer 106a. Interconnects 502 are thus formed in the trenches 202. See FIG. 5.

Figure 6:
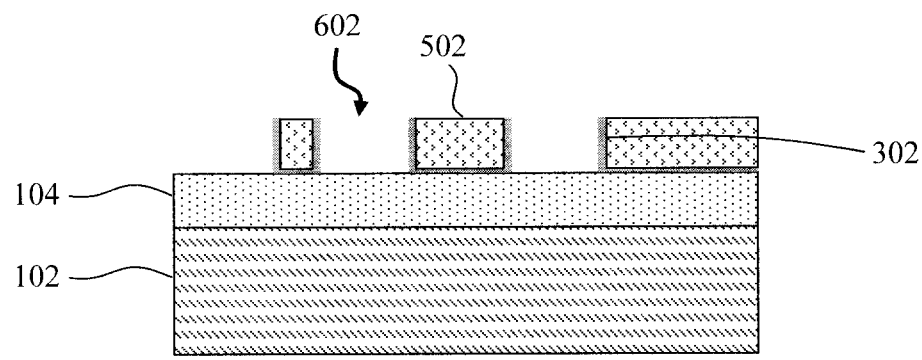
FIG. 6 is a cross-sectional diagram illustrating the remaining bottom hardmask layer having been removed according to an embodiment of the present invention.

The remaining bottom hardmask layer 106a is then removed. See FIG. 6. The bottom hardmask layer 106b can be removed using a selective directional (i.e., anisotropic) etching process such as a nitride-selective reactive ion etching (RIE) or using highly selective wet chemistries that include an oxidizing agent, metal protection agent and a pH stabilizer in water or solvent mixtures. Suitable wet chemistries consist of a quaternary ammonium hydroxide, hydrogen peroxide, benzotriazole passivation agents. As a result, the interconnect structure now includes interconnects 502 disposed on the underlayer 104. If present, the liner 302 surrounds the bottom and sidewalls of the interconnects 502. Further, as shown in FIG. 6, removal of the bottom hardmask layer 106a leaves behind trenches 602 in between the interconnects 502. For clarity, trenches 602 may also be referred to herein as 'second' trenches so as to distinguish them from trenches 202 which are also referred to herein as 'first' trenches.

The interconnects 502 are then buried in an ILD 702. See FIG. 7. Again, for clarity, ILD 702 may also be referred to herein as 'second' ILD so as to distinguish it from ILD 104b which is also referred to herein as a 'first' ILD. Suitable materials for ILD 702 include, but are not limited to, oxide materials such as SiOx. ILD 702 can be deposited onto the interconnects 502 and into the trenches 602 using a process such as CVD, ALD or PVD.

Figure 7:
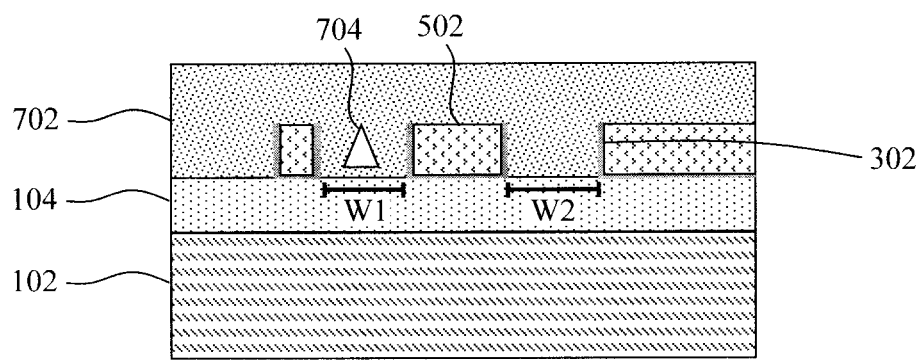
FIG. 7 is a cross-sectional diagram illustrating the interconnects having been buried in an interlayer dielectric (ILD) according to an embodiment of the present invention.

Another notable feature of the present techniques is illustrated in FIG. 7. Namely, if so desired, air gaps 704 can be formed in the ILD 702 in between the interconnects 502. The introduction of air gaps in integrated circuits can reduce capacitance and lower the effective dielectric constant in device regions with high current densities. See, for example, Paul Besser, "BEOL Interconnect Innovations for Improving Performance," NCCAVS Symposium in San Jose, Ca. (February 2017) (35 pages), the contents of which are incorporated by reference as if fully set forth herein.

By way of example only, air gaps 704 are introduced when the ILD 704 being deposited into the trenches 602 pinches off the opening to the trench before the trench is completely filled. The unfilled space forms the air gap. Air gaps 704 can be engineered into the design based. e.g., on the width W of the trenches 602 and/or deposition process for the ILD 704. Namely, employing a smaller width W can lead to pinch off and air gap formation. Further, based on the above-described process (e.g., via the placement of trenches 202 in the hardmask 106), the width W between interconnects 502 can be varied to produce air gaps 704 or no air gaps 704 between select interconnects 502. For instance, in the example shown in FIG. 7, a width W1 is present between the left and center interconnects 502, while a width W2 is present between the center and right interconnects 502, and wherein W2>W1. In the present example, the smaller width W1 results in an air gap 704 between the left and center interconnects 502, whereas the larger width W2 results in no air gap 704 between the center and right interconnects 502.

A conformal deposition process such as CVD (see above) has been shown to produce air gaps by this pinch off process. See, for example, Ed Korczynski, "Air-gaps in Copper Interconnects for Logic." Semiconductor Manufacturing & Design Community (October 2014) (6 pages), the contents of which are incorporated by reference as if fully set forth herein. With a conformal deposition process like CVD, the material being deposited builds up along the bottom and sidewalls of the trenches. If the material along the sidewalls converges at the tops of the trenches before the trenches are fully filled, then air gaps are formed. As provided above, the presence/absence of air gaps can be controlled by varying the width of the trenches. Namely, increasing the width allows the trenches to be fully filled without any pinch off or air gap.

As provided above, a variety of different process are contemplated herein for patterning the hardmask 106. According to an exemplary embodiment, a SIT process is employed in accordance with the above-described interconnect formation process as illustrated in FIGS. 8-17. Like structures with those above are numbered alike in the following description.

Figure 8:
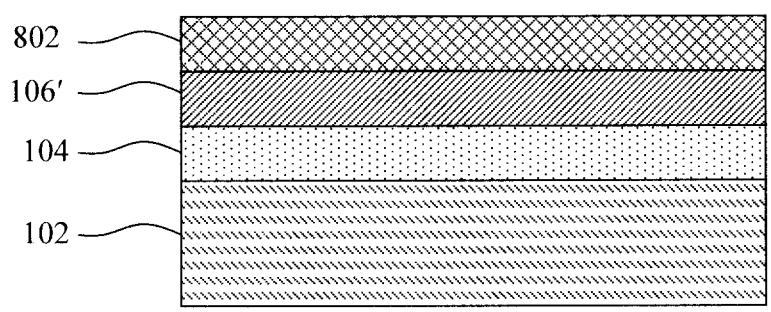
FIG. 8 is a cross-sectional diagram illustrating, according to an alternative embodiment, the underlayer having been disposed on the substrate, the hardmask (including the bottom and top hardmask layers) having been formed on the underlayer, and a mandrel layer having been deposited onto the hardmask according to an embodiment of the present invention.

As shown in FIG. 8, the process begins in the same general manner with a CMOS substrate 102, underlayer 104 (including, e.g., a capping layer 104a, an ILD 104b, etc.) disposed on the substrate 102, and a hardmask 106' (e.g., TiN) disposed on the underlayer 104. The details of each of these layers were provided above. As provided above, the hardmask can optionally include multiple layers such as a (e.g., TiN) bottom hardmask layer 106a and a (e.g., SiOx) top hardmask layer 106a. In the present example, however, a single layer (e.g., TiN) hardmask 106' is employed.

In this example, however, a mandrel layer 802 is next deposited onto the hardmask 106'. Suitable materials for mandrel layer 802 include, but are not limited to, amorphous silicon (Si), amorphous carbon and/or an organic planarizing layer (OPL). Amorphous Si films can be deposited, for example, using CVD or PVD. Amorphous carbon films can be deposited, for example, using DC magnetron sputtering. According to an exemplary embodiment, the mandrel layer 802 has a thickness of from about 5 nm to about 50 nm and ranges therebetween.

Figure 9:
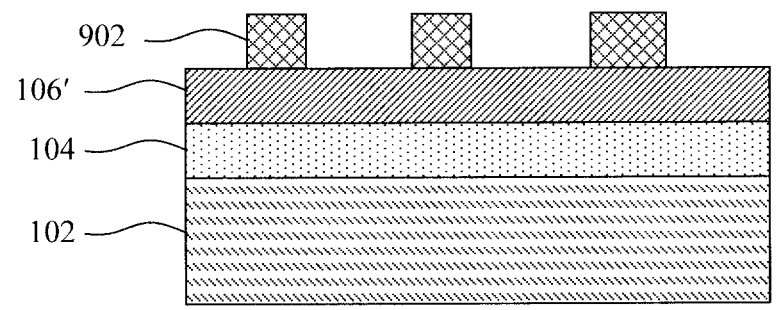
FIG. 9 is a cross-sectional diagram illustrating the mandrel layer having been patterned into a plurality of individual mandrels according to an embodiment of the present invention.
Figure 10:
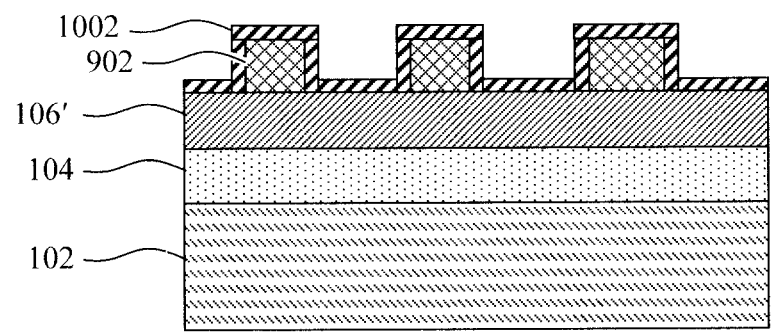
FIG. 10 is a cross-sectional diagram illustrating a conformal spacer layer having been deposited onto the mandrels and onto the hardmask in between the mandrels according to an embodiment of the present invention.
Figure 11:
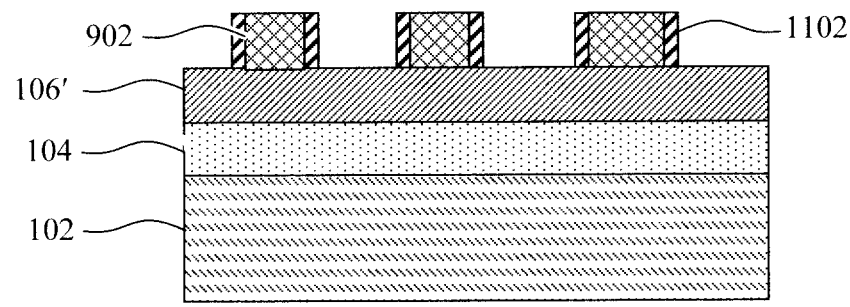
FIG. 11 is a cross-sectional diagram illustrating an etch back of the spacer layer having been used to remove the spacer layer from horizontal surfaces, leaving behind spacers along opposite sides of each of the mandrels according to an embodiment of the present invention.

As shown in FIG. 9, the mandrel layer 802 is patterned into a plurality of individual mandrels 902. Standard lithography and etching techniques using a directional (anisotropic) etching process such as RIE can be used to pattern the mandrels 902.

A conformal spacer layer 1002 is then deposited onto the mandrels 902 and onto the hardmask 106 in between the mandrels 902. See FIG. 10. Suitable materials for the spacer layer 1002 include, but are not limited to, SiOx. Spacer layer 1002 can be deposited using a process such as CVD, ALD or PVD. According to an exemplary embodiment, the spacer layer 1002 has a thickness of from about 4 nm to about 20 nm and ranges therebetween.

Figure 12:
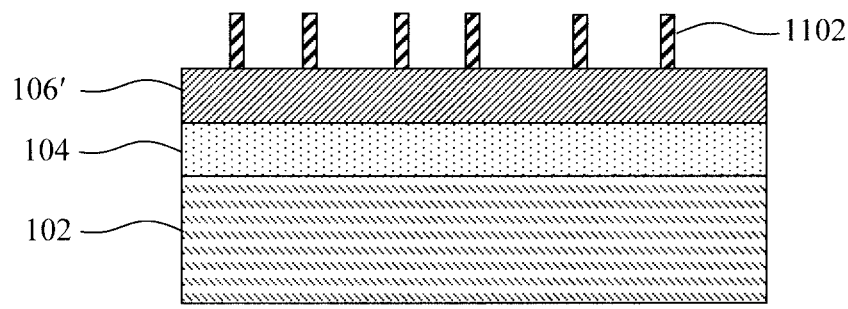
FIG. 12 is a cross-sectional diagram illustrating the mandrels having been removed selective to the spacers according to an embodiment of the present invention.

An etch back of the spacer layer 1002 is then used to remove the spacer layer 1002 from horizontal surfaces, leaving behind spacers 1102 along opposite sides of each of the mandrels 902. See FIG. 11. According to an exemplary embodiment, a directional (anisotropic) etching process such as RIE is used for the etch back of spacer layer 1002. As shown in FIG. 12, the mandrels 902 are then removed selective to the hardmask layer 106' and the spacers 1102. As will be described in detail below, the spacers 1102 will be used to pattern the underlying hardmask 106. As provided above, the mandrels 902 can be formed from amorphous Si and/or amorphous carbon. In that case, a Si or carbon selective RIE can be employed to selectively remove the mandrels 902.

The instant SIT process is a pitch doubling technique. Namely, for every patterned mandrel 902 there are now two spacers. As highlighted above, this SADP process enables the patterning of features at a sub-lithographic pitch, i.e., a pitch that is below the resolution of a direct patterning process.

If so desired, a standard block mask 1302 can be formed covering one or more of the spacers 1102. See FIG. 13. The spacers 1102 outside of the block mask 1302 will be used for patterning (while those covered by the block mask 1302 will not). Namely, as shown in FIG. 13, the spacers 1102 to the right of the block mask 1302 are used to pattern at least one trench 1304 in the hardmask 106.

Figure 13:
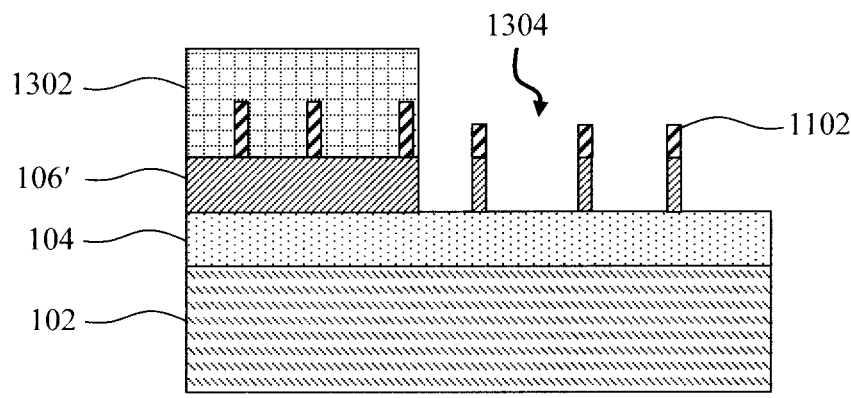
FIG. 13 is a cross-sectional diagram illustrating an (optional) block mask having been formed covering one or more of the spacers, and the spacers not covered by the block mask having been used to pattern at least one trench in the hardmask according to an embodiment of the present invention.

As shown in FIG. 13, the trenches 1304 extend through the hardmask 106', stopping on the underlayer. The trench etch slightly recessed the spacers 1102. See, for example, the reduced height of the spacers 1102 on the right as compared to the spacers 1102 covers by the block mask 1302. The block mask 1302 is removed at the end of the trench etch.

Optionally, a conformal liner 302' (e.g., Ti, Ta, Ru, Hf, TiN and/or TaN) as a diffusion barrier layer and an adhesion promoter layer—see above) is deposited onto the hardmask 106' and underlayer 104 at the bottom of the trenches 1304, lining the bottom and sidewalls of the trenches 1304. See FIG. 14. As described above, the use of a liner 302' is optional since its use depends on what interconnect metal(s) are being used. For instance, with Cu interconnects use of a liner 302' is preferable to prevent diffusion of the Cu into surrounding dielectrics and degradation of device performance. However, with metals such as Co and/or W, such diffusion is not a concern.

Figure 14:
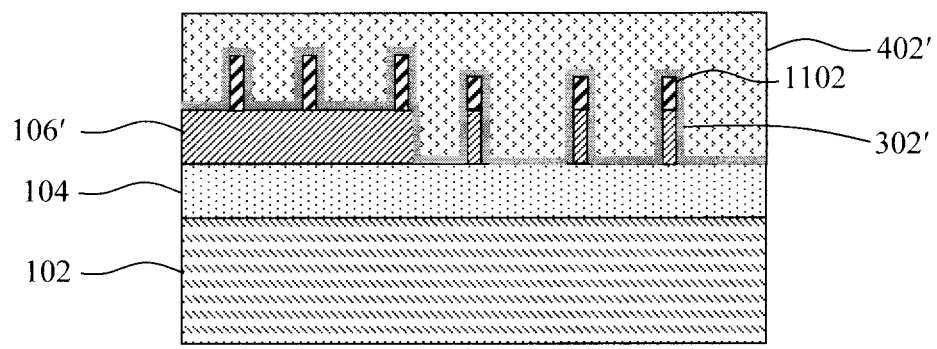
FIG. 14 is a cross-sectional diagram illustrating a conformal liner having been deposited onto the hardmask, lining the bottom and sidewalls of the trenches, and at least one metal having been deposited over the hardmask (and liner if present), filling the trenches according to an embodiment of the present invention.
Figure 15:
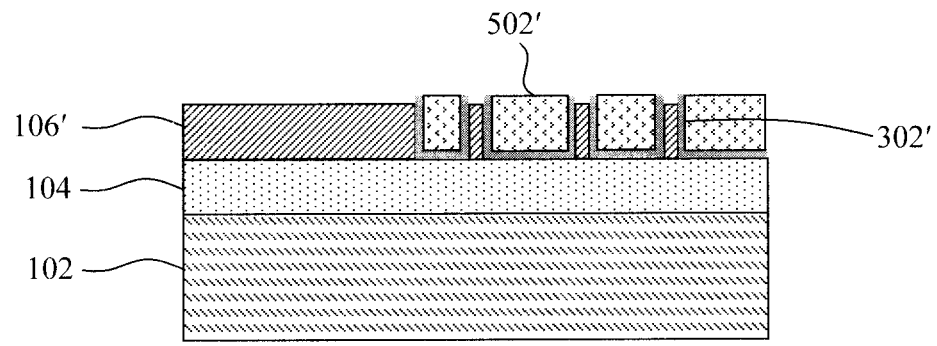
FIG. 15 is a cross-sectional diagram illustrating a polishing process such as CMP having been used to remove the excess metal and, if present, the liner and top hardmask layer over the bottom hardmask layer forming interconnects in the trenches according to an embodiment of the present invention.

At least one metal 402' is then deposited over the hardmask 106' (and liner 302' if present), filling the trenches 1304. As highlighted above, suitable metals include, but are not limited to, Cu, Co and/or W. As shown in FIG. 14, the deposited metal 402' overfills the trenches 1304.

A polishing process such as CMP is then used to remove the excess metal 402' and, if present, the liner 302' and spacers 1102 over the hardmask layer 106'. Interconnects 502' are thus formed in the trenches 1304. See FIG. 15.

Figure 16:
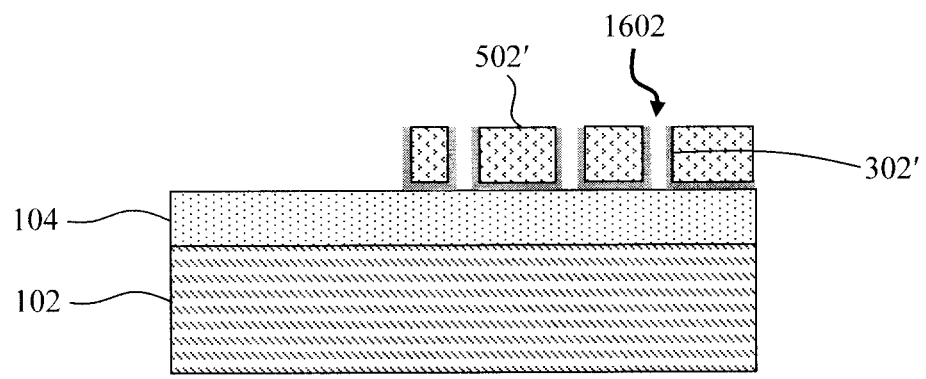
FIG. 16 is a cross-sectional diagram illustrating the remaining bottom hardmask layer having been selectively removed according to an embodiment of the present invention.
Figure 17:
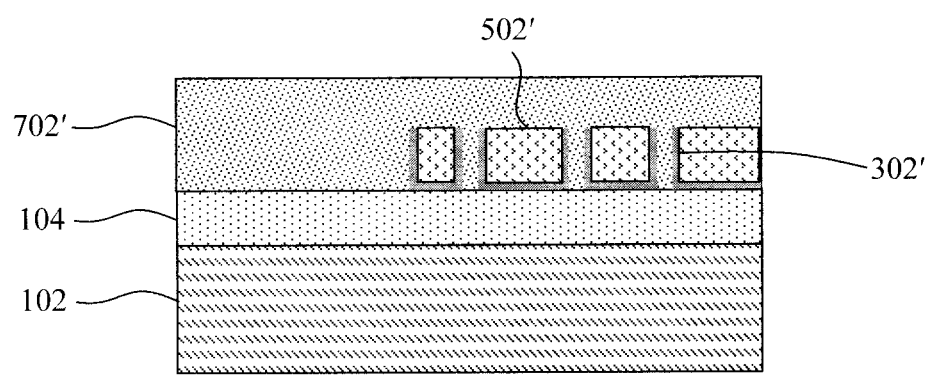
FIG. 17 is a cross-sectional diagram illustrating the interconnects having been buried in an interlayer ILD according to an embodiment of the present invention.

The remaining hardmask layer 106' is then selectively removed. See FIG. 16. As a result, the interconnect structure now includes interconnects 502' disposed on the underlayer 104. If present, the liner 302' surrounds the bottom and sidewalls of the interconnects 502'. Further, as shown in FIG. 16, removal of the hardmask layer 106' leaves behind trenches 1602 in between the interconnects 502'.

The interconnects 502' are then buried in an ILD 702' (e.g., SiOx) that at least partially fills the trenches 1602. See FIG. 17. As provided above, the width of the trenches 1602 can be engineered to create air gaps, if so desired, in the ILD 702' in between the interconnects 502'.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming interconnects on a substrate, the method comprising the steps of:
   forming an underlayer on the substrate;
   forming a hardmask on the underlayer;
   patterning first trenches in the hardmask that extend down to the underlayer;
   forming the interconnects in the first trenches;
   fully removing the hardmask which leaves behind second trenches in between the interconnects; and
   burying the interconnects in an interlayer dielectric (ILD) that is deposited on the interconnects and into the second trenches.

2. The method of claim 1, wherein the substrate comprises at least one complementary metal oxide semiconductor (CMOS) device.

3. The method of claim 1, wherein the underlayer comprises a stack of layers.

4. The method of claim 3, wherein the stack of layer comprises:
a capping layer disposed on the substrate; and
an ultralow-κ ILD disposed on the capping layer.

5. The method of claim 4, wherein the capping layer comprises a material selected from the group consisting of: silicon carbon nitride (SiCN), hydrogen silicon carbon nitride (SiCNH), aluminum nitride (AlN) and combinations thereof.

6. The method of claim 4, wherein the ultralow-κ ILD has a dielectric constant κ of less than 2.7.

7. The method of claim 1, wherein the hardmask comprises titanium nitride (TiN).

8. The method of claim 1, wherein the hardmask comprises:
a bottom hardmask layer comprising TiN disposed on the underlayer; and
a top hardmask layer comprising silicon oxide (SiOx) disposed on the bottom hardmask layer.

9. The method of claim 1, further comprising the step of:
depositing a liner onto the hardmask, lining a bottom and sidewalls of the first trenches.

10. The method of claim 9, wherein the liner comprises at least one material selected from the group consisting of: titanium (Ti), tantalum (Ta), ruthenium (Ru), hafnium (Hf), titanium nitride (TiN), tantalum nitride (TaN) and combinations thereof.

11. The method of claim 1, wherein the step of forming the interconnects in the first trenches comprises the steps of:
depositing at least one metal over the hardmask and filling the first trenches; and
polishing the at least one metal to form the interconnects in the first trenches.

12. The method of claim 11, wherein the at least one metal is selected from the group consisting of: copper (Cu), cobalt (Co), tungsten (W) and combinations thereof.

13. The method of claim 1, wherein air gaps are present in the ILD between two or more of the interconnects.

14. The method of claim 1, wherein the trenches are patterned in the hardmask using a sidewall image transfer process.

15. The method of claim 14, further comprising the steps of:
forming mandrels on the hardmask;
forming spacers along opposite sides of the mandrels;
removing the mandrels selective to the hardmask and the spacers; and
using the spacers to pattern the first trenches in the hardmask.

16. A method for forming interconnects on a substrate, the method comprising the steps of:
forming an underlayer on the substrate;
forming a hardmask comprising TiN on the underlayer;
forming mandrels on the hardmask;
forming spacers along opposite sides of the mandrels;
removing the mandrels selective to the hardmask and the spacers;
using the spacers to pattern first trenches in the hardmask that extend down to the underlayer;
forming the interconnects in the first trenches;
removing the spacers;
fully removing the hardmask which leaves behind second trenches in between the interconnects; and
burying the interconnects in an ILD that is deposited on the interconnects and into the second trenches.

17. The method of claim 16, further comprising the step of:
depositing a liner onto the hardmask, lining a bottom and sidewalls of the first trenches, wherein the liner comprises at least one material selected from the group consisting of: Ti, Ta, Ru, Hf, TiN, TaN and combinations thereof.

18. The method of claim 16, wherein the step of forming the interconnects in the first trenches comprises the steps of:
depositing at least one metal over the hardmask and filling the first trenches; and
polishing the at least one metal to form the interconnects in the first trenches, wherein the at least one metal is selected from the group consisting of: Cu, Co, W and combinations thereof.

* * * * *